(12) United States Patent
Corcoran et al.

(10) Patent No.: US 7,237,718 B2
(45) Date of Patent: Jul. 3, 2007

(54) TEST SYSTEM

(75) Inventors: Aidan Ivor Corcoran, County Dublin (IE); Robert C. Hilliard, Dublin (IE)

(73) Assignee: Acquirer Systems Research Limited, Dublin (IE)

( * ) Notice: Subject to any disclaimer, the term of this patent is extended or adjusted under 35 U.S.C. 154(b) by 0 days.

(21) Appl. No.: 11/498,199

(22) Filed: Aug. 3, 2006

(65) Prior Publication Data

US 2006/0267611 A1 Nov. 30, 2006

Related U.S. Application Data

(63) Continuation of application No. PCT/IE05/00008, filed on Feb. 7, 2005.

(30) Foreign Application Priority Data

Feb. 6, 2004 (IE) .................... 2004/0073

(51) Int. Cl.
*G06K 7/00* (2006.01)
*G06K 19/00* (2006.01)
*G06K 7/06* (2006.01)
*G06K 5/00* (2006.01)
*G06K 7/04* (2006.01)

(52) U.S. Cl. .................. 235/438; 235/441; 235/446; 235/487; 235/380

(58) Field of Classification Search .............. 235/438, 235/441, 487, 380, 462.48, 451, 491; 710/301
See application file for complete search history.

(56) References Cited

U.S. PATENT DOCUMENTS

| 5,577,197 | A | | 11/1996 | Beck | 395/183 |
| 5,585,617 | A | * | 12/1996 | Ohbuchi et al. | 235/491 |
| 6,035,357 | A | * | 3/2000 | Sakaki | 710/301 |
| 6,129,271 | A | | 10/2000 | Kubitz | 235/379 |
| 6,292,909 | B1 | | 9/2001 | Hare | 714/40 |
| 6,336,590 | B1 | | 1/2002 | Kubitz | 235/479 |
| 6,808,113 | B2 | * | 10/2004 | Yamasaki | 235/451 |
| 6,988,931 | B1 | | 1/2006 | Martinet et al. | 450/57 |
| 2004/0220575 | A1 | | 11/2004 | Kubitz | 705/39 |
| 2005/0145699 | A1 | * | 7/2005 | Zucker et al. | 235/462.48 |

FOREIGN PATENT DOCUMENTS

IE 69191 8/1996
WO WO00/39684 7/2000

* cited by examiner

*Primary Examiner*—Michael G. Lee
*Assistant Examiner*—Thien T. Mai
(74) *Attorney, Agent, or Firm*—Jacobson Holman PLLC

(57) ABSTRACT

A test system (1) has a test controller (2) and at least one probe (3). An ICC card (C) is inserted into a slot (8) of the probe (3), and a card-simulating interface (5) of the probe (3) is inserted in the slot (S) of the terminal (T) under test. The test controller (2) communicates bi-directionally with the terminal (T) and an external transaction processing system (B). Up to six data monitoring points (100 to 105) are possible, different numbers of points providing different modes of operation.

22 Claims, 5 Drawing Sheets

TEST SYSTEM

This is a continuation of PCT/IE2005/00008 filed 7 Feb. 2005 and published in English.

FIELD OF THE INVENTION

The invention relates to testing of transaction processing systems such as those including a merchant terminal for reading transaction cards and a transaction processing system.

PRIOR ART DISCUSSION

US2004/0220875 describes a test system having a number of processors for generating scripts and transmitting them to a system under test. U.S. Pat. No. 6,336,590 describes a test system for simulating a switch by generating scripts and a validator for comparing responses with standards. U.S. Pat. No. 6,129,271 also describes a test system which builds scripts.

The invention is directed towards providing a test system for more versatile and/or more comprehensive testing of transaction processing equipment of the type identified above.

SUMMARY OF THE INVENTION

According to the invention there is provided a test system for testing transaction processing equipment, the test system comprising:
  a probe comprising:
    an interface to a transaction terminal,
    a monitoring circuit to passively monitor data transmitted from the terminal and transmitted to the terminal;
  a test controller;
  a controller interface for capturing monitored data;
  a database for storing monitored data and transaction conformance data; and
  a transaction conformance verifier for verifying operations of the transaction processing equipment under test by comparing monitored data and the conformance data Thus, the test system can test the transaction processing system in a comprehensive manner without being intrusive.

In one embodiment, the monitoring circuit passively monitors data transmitted from the terminal to a card and data transmitted from the card to the terminal.

In one embodiment, the probe comprises a card reader for reading the card presented for a test and for routing card data to the terminal.

In one embodiment, the probe routes the card data to the controller interface.

In another embodiment, the probe routes the card data on a hard-wired link to contact pads on an interface for insertion in the terminal.

In a further embodiment, the interface has at its extremity a configuration identical to that of a card, but is longer than a card to accommodate different terminal physical configurations.

In one embodiment, the monitoring circuit monitors signals Via an opto-isolator. This helps to ensure that testing is non-intrusive.

In one embodiment, the probe comprises a switch for switching between card signal frequencies to choose an appropriate frequency.

In one embodiment, the probe comprises a control unit for generating probe status outputs.

In one embodiment, the outputs indicate if the probe is transmitting monitored data to the controller interface.

In one embodiment, the outputs indicate if a card is correctly inserted into the probe.

In one embodiment, the outputs indicate if the probe is correctly connected to the terminal.

In one embodiment, the probe converts the monitored data to a test controller format, and routes it in that format to the test controller.

In another embodiment, the test controller comprises an interface to the terminal and an interface to an external transaction processing system.

In one embodiment, the test controller performs bi-directional routing between the terminal and the external system.

In one embodiment, the test controller comprises parsers for parsing monitored data and converting it into normalized format for the database. This allows excellent versatility for processing the data to perform various verification operations.

In one embodiment, the test controller comprises a switch engine for reading normalized data from the database and routing normalized data according to rules in the database.

In one embodiment, the switch engine uses elements of normalized data to execute said rules.

In one embodiment, the routing decisions may be to reject traffic, authorise data and return it to its source, or route data to a different communications parser.

In one embodiment, the switch engine routes data to the conformance verifier for verification according to rules in the database.

In one embodiment, the verifier is configured to perform conformance verification in a mode having the following data monitoring points:
  a first point between the card and the terminal;
  a second point between the terminal and the card;
  a third point between the terminal and the test system;
  a fourth point between the test system and the terminal;
  a fifth point between the external transaction processing system and the test system; and
  a sixth point between the test system and the external transaction processing system.

In one embodiment, the verifier is configured to perform conformance verification in a mode having only the first, second, third, and fourth points.

In one embodiment, the test controller comprises a simulator for simulating an external transaction processing system as seen by the terminal.

In one embodiment, the verifier is configured to perform conformance verification with data from only the first and second points.

In a further embodiment, the verifier is configured to perform conformance verification with data from only the fifth and sixth points.

In one embodiment, the test system comprises a simulator for simulating a terminal as seen by an external transaction processing system.

DETAILED DESCRIPTION OF THE INVENTION

Brief Description of the Drawings

The invention will be more clearly understood from the following description of some embodiments thereof, given by way of example only with reference to the accompanying drawings in which.

DESCRIPTION OF THE EMBODIMENTS

Figure 1:
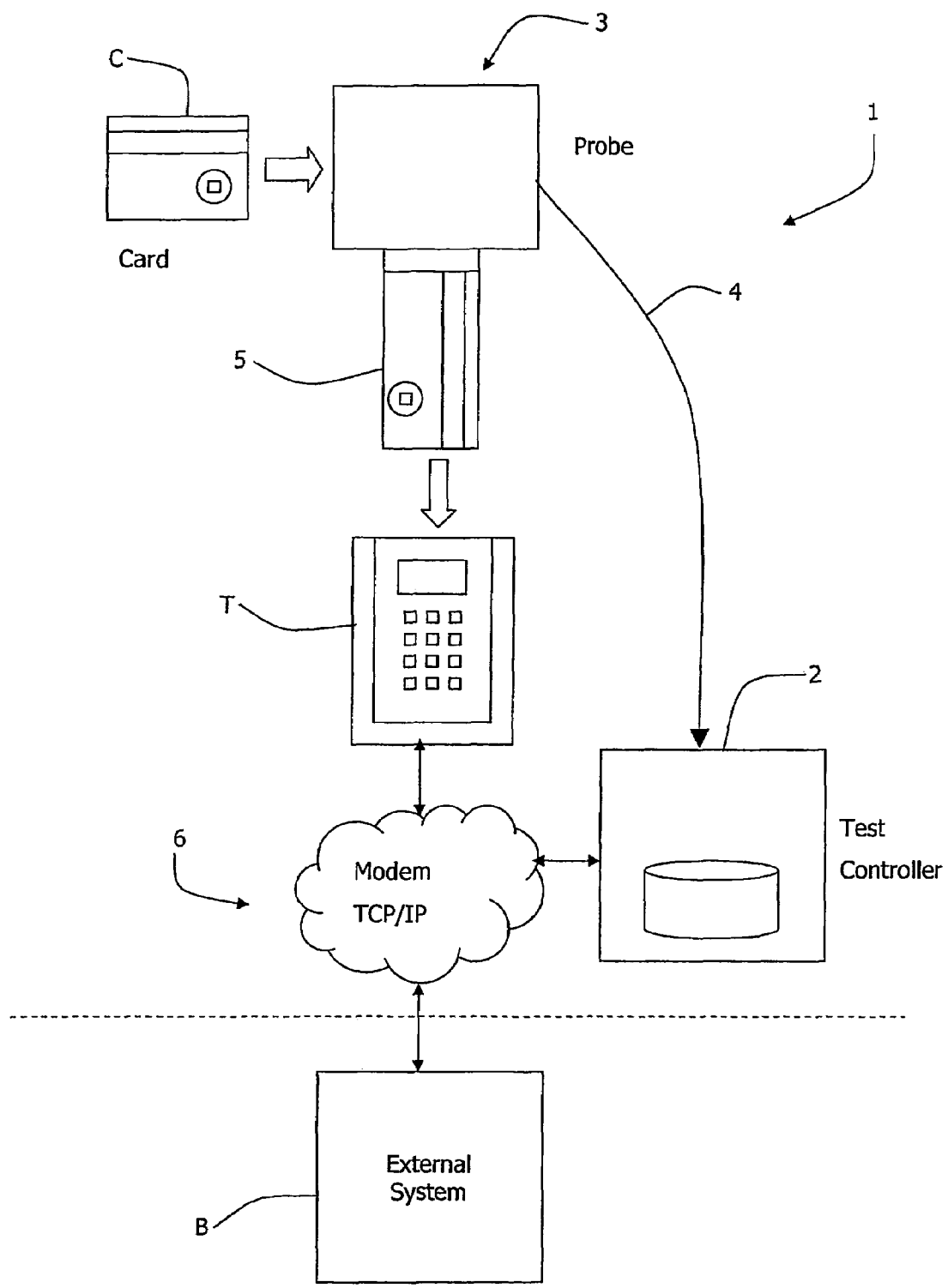
FIG. 1 is a diagram of the components of a test system of the invention.

Referring to FIG. 1 a test system 1 comprises a test controller 2 and a probe 3. While only one probe is shown, the controller 2 may be connected to multiple probes, only one being shown for clarity. There is an interface 4 between the probe 3 and the controller 2, and a card-simulating interface 5 between the probe 3 and a point of sale (POS) terminal T under test. In this embodiment the terminal is a point-of-sale terminal for receiving integrated chip cards (ICCs) as defined by ISO7816 inter alia. However, it may alternatively be a transaction gathering device of any type, such as one which does not receive a card but instead user codes entered at a keypad.

The terminal T can, as is conventional, communicate via a TCP/IP network 6 with an external bank transaction processing host system B. The controller 2 of the test system is PC-based and can also communicate via the network 6 with the terminal T and/or the external system B.

Figure 2:
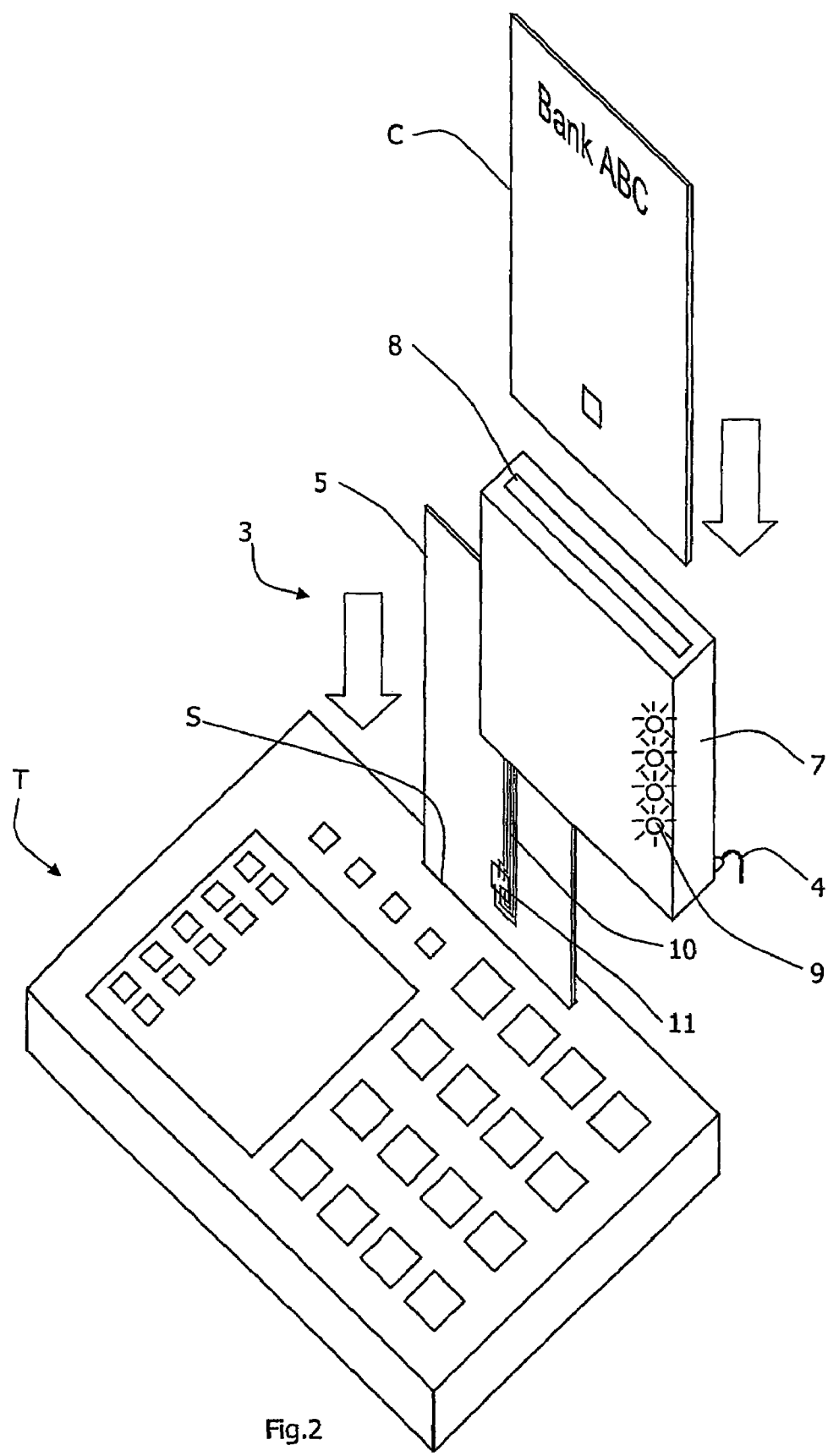
FIG. 2 shows a probe of the test system interfacing with a terminal under test.
Figure 3:
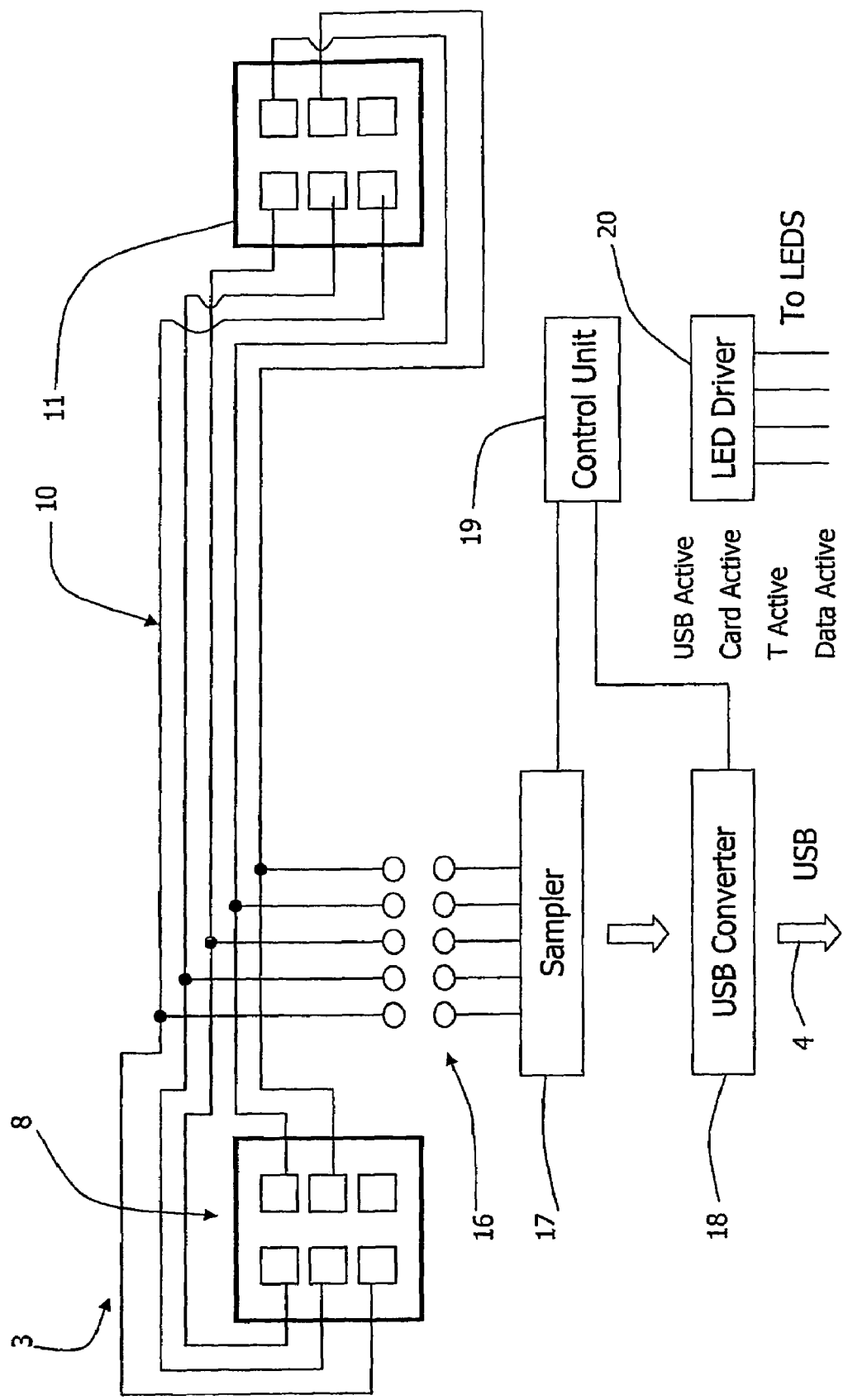
FIG. 3 shows architecture of the probe in more detail.

Referring to FIGS. 2 and 3 the probe 3 comprises a housing 7 containing an internal probe circuit, a card reader 8, and status LEDs 9. The internal circuit is on the same PCB as that of the interface 5 extending from the housing and taking the form of an elongated card. It has tracks 10 extending directly from the card reader 8 to contact pads 11 which are exposed to mimic those of a conventional ICC card. As shown in FIG. 2, for interfacing of the probe 3 with the terminal T under test, the interface 5 is simply inserted into the conventional ICC card slot S of the terminal T.

Referring particularly to FIG. 3, the internal circuit of the probe 3 comprises the tracks 10 extending between the card reader 8 and the contact pads 11. That part of the tracks 10 which are covered over by the housing 7 are tapped to an opto-isolator 16, in turn connected to a sampler 17 which samples at the relevant rate. The sampler feeds the monitored signals to a converter 18 which converts them to a USB format for transmission via a USB port to the test controller 2. FIG. 3 also shows a probe control unit 19 and a driver 20 for the status LEDs 9. The status indications are to activate one LED for each of:

USB Active, probe 3 transmitting to the controller 2;

Card Active: card is correctly inserted into the probe 3;

T Active: interface 5 correctly inserted into terminal T; and

Data Active: signal processing in progress (LED flickering).

The control unit 19 determines the sample rate of the sampler 17 according to configuration of the test controller 2.

It will be noted that the probe 3 acts in a completely non-intrusive manner, and possibility of intrusiveness arising from electrical noise is avoided because of the opto-isolators 16 and the hard-wired links between the contacts 8 and 11. Its role is passive and the outputs on the interfaces 4 and 5 are uni-directionally outgoing.

Referring again to FIG. 1, the terminal T relays signals to the test controller 2 by a modem, and the test controller 2 relays signals to the external system B by a different modem. There is typically some protocol conversion performed by the test controller 2. In other embodiments alternative and differing transport mechanisms such as TCP/IP, X.25 or serial may be used between each of the terminal T, the external system B and the test controller 2 as desired. All interfaces are bi-directional.

Figure 4:
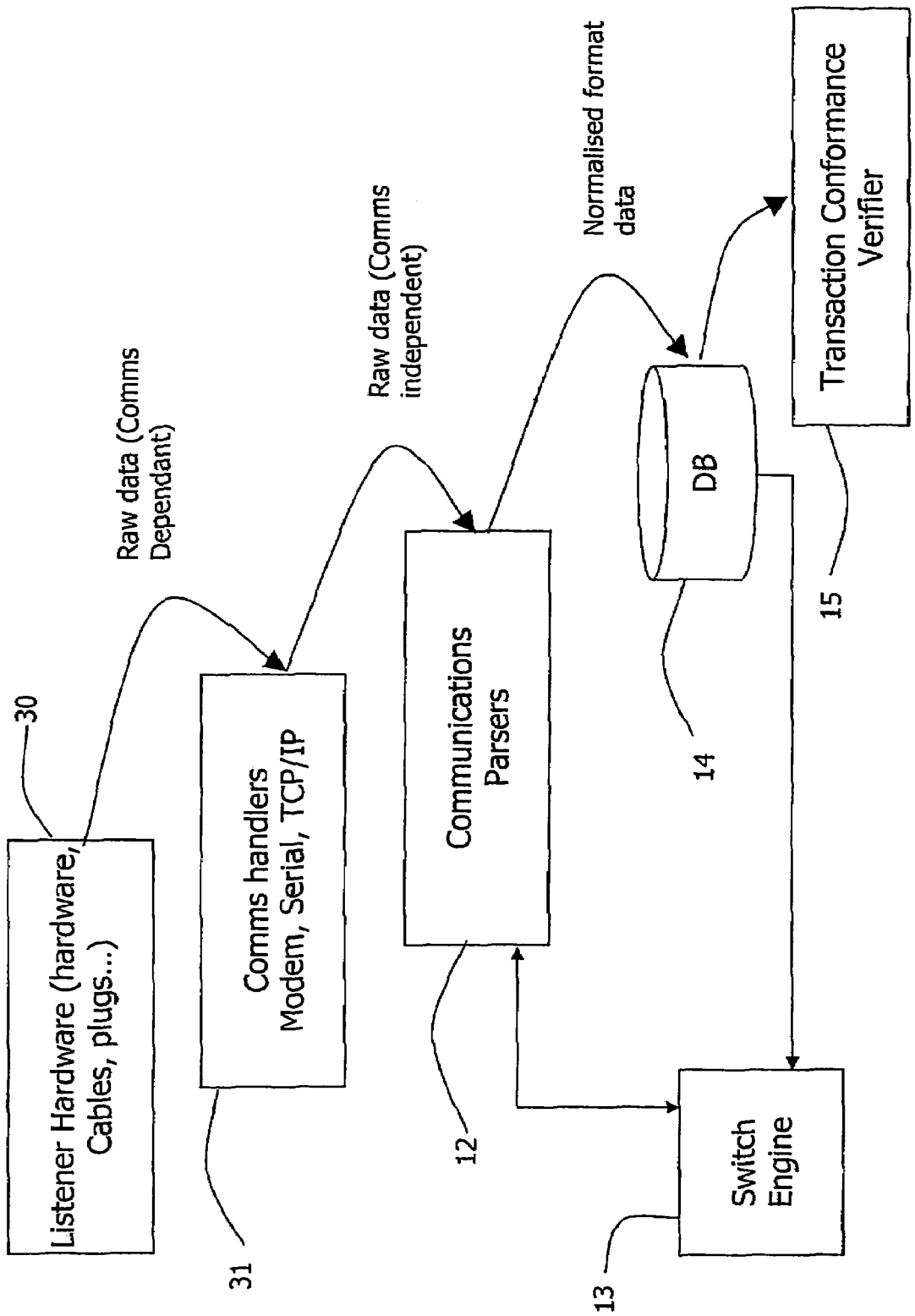
FIG. 4 is a diagram showing generalised structure of the overall test system.

Referring to FIG. 4, the structure of the test system 1 comprises listener hardware 30 including the probe 3 and physical links to systems such as the terminal T being tested. Communication handlers 31 complete the interfaces between the components of the test system 1 and the system under test. The controller 2 includes communication parsers 12, a switch engine 13, a database 14, and a transaction conformance verifier 15.

The parsers 12 parse raw data from the handlers 31 and generate and write normalized data to the database 14, irrespective of its source. This allows the verifier 15 to operate completely with data in a single, universal, normalized format. This allows a very simple and versatile approach to verification operations. The switch engine 13 reads routing rules from the database 15 and routes normalized traffic according to said rules using data elements contained within the normalized data format, and either (a) rejects the traffic (b) authorizes the data and returns it to whence it came or (c) passes the data to another communications parser for dispatch to another system for authorisation or further routing. Data to be conformance verified is likewise generated in normalized format by the communications parsers 12 and routed by the switch engine 13 to the transaction conformance verifier 15 according to rules in the database 14.

Figure 5:
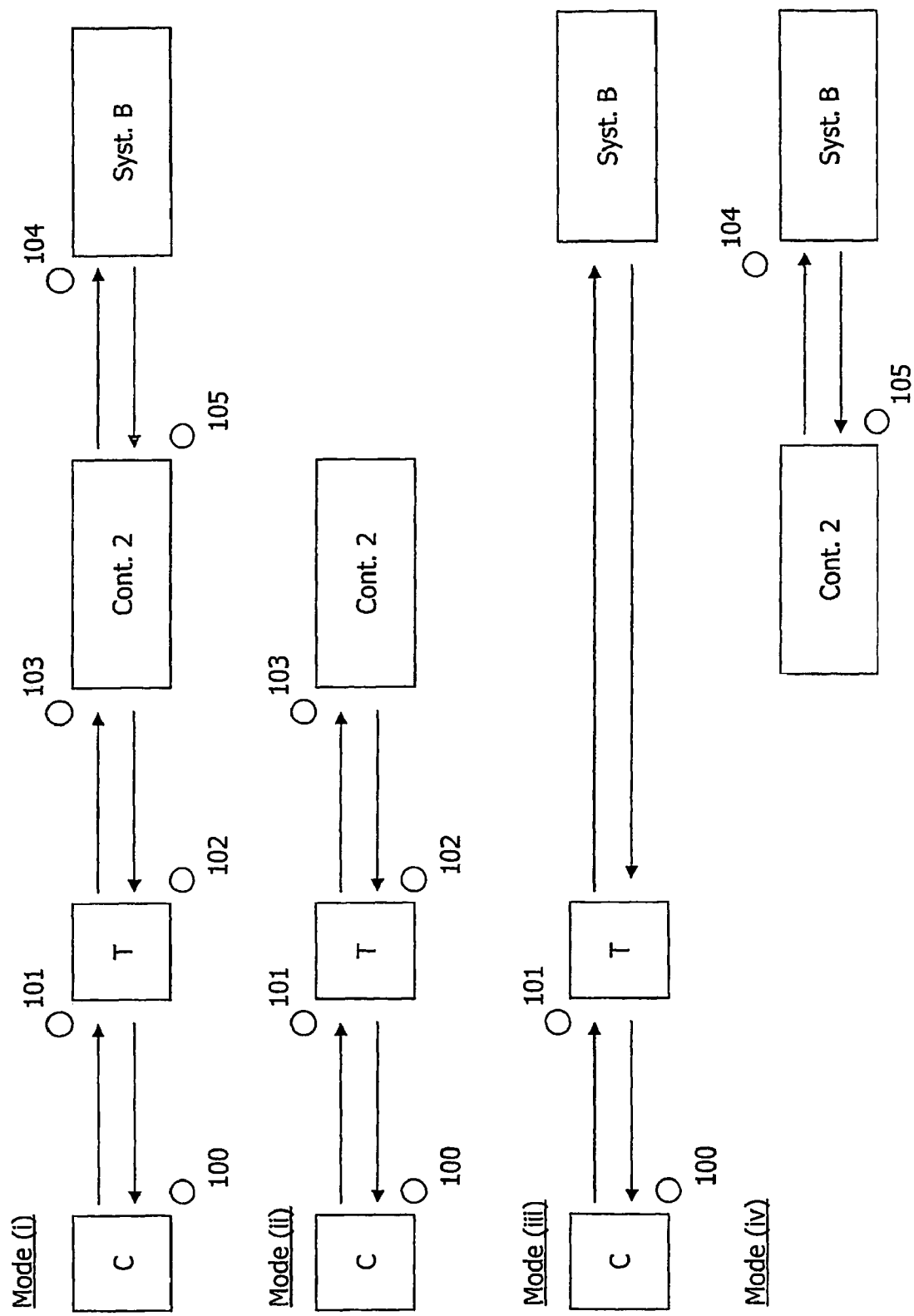
FIG. 5 is a diagram showing the four modes of operation of the test system and the data monitoring points in each.

The main data transfer routes are shown in FIG. 5 for the typical mode of operation of the test system 1 (Mode(i)), and also for three other modes. In FIG. 5 the test controller, the components of a transaction processing system under test, and a card are indicated by the same reference numerals and letters as in the preceding drawings. The data monitoring points are indicated by small circles and the numerals 100–105inclusive. The six points are:

100: terminal T to card C, monitored by the probe 3;

101: card C to terminal T, also monitored by the probe 3;

102: controller 2 to terminal T, intercepted by the controller 2;

103: terminal T to controller 2, intercepted by the controller 2;

104: controller 2 to system B, intercepted by the controller 2;

105: system B to controller 2, intercepted by the controller 2;

Test cards may be provided with the test system, or provided by the card or equipment issuers. The issuer may require a retailer to purchase test cards for testing of their equipment. Test cards provided by a third party can be used with the test system, and will determine the nature of the test regime. The controller 2 comprises a user interface which prompts the user with a given sequence of test transactions to perform on specific test cards. There can be a number of different testing regimes for different degrees of testing and different transaction conformance and classification purposes, and for use with different test card sets. The desired test regime determines the Mode (i) to (iv) to choose.

For each of the data-monitoring points 100–105, the database 14 contains, in normalized format, the complete test/fail criteria for the operation of one or more tests for one or more cards C in detail sufficient to verify the integrity of the real-time communication between, or at, any, or all, of the data points 100–105 specified in the database 14.

The database 14 also contains, as well as communication information from the parsers 12, the following information that is used by the verifier 15:
  a list of atomic communications that can or did (previously logged) occur between card C and the terminal T.
  and that can or did occur between the terminal T and card C,
  and can or did occur between terminal T and the system B,
  and can or did occur between the system B and the terminal T,
  a collection of rules which describe the correct data elements that form a legal end-to-end transaction, and
  a further collection of more complex rules for security or tracking or fraud detection purposes.

The verifier 15 also comprises a rule engine, which interprets the rules, applies them to the states and communications that have occurred in a transaction, and determines whether the sequence of communications, the timings between communications, and the series of states that each part was in (the card C, the terminal T, and the system B) forms a legal transaction. Transactions, legal or not, can also be classified.

The database 14 stores valid communications that make up a transaction, and a list of possible states that parties to a transaction can be in, as well as rules for conformance checking to test validity. The data includes, but is not limited to, account type, location (country), time, currency, amount, identity (card authorised, owner identity verification), transaction type, merchant (retailer—acquirer equipment holder—details), institution (financial), and acquirer equipment type.

The more detailed the context, the more detailed are the rules.

Referring again to FIG. 5, for Mode (i) the controller 2 is linked between the terminal T and the system B. This allows a fill set of the six data monitoring points.

In Mode (ii) the controller 2 simulates an external transaction processing system, generating responses so that the terminal T "thinks" it is communicating with a transaction processing system such as that of a financial institution. Of course, there are therefore no data monitoring points 104 and 105 and no external system B to test. The simulation programs of the controller 2 generate responses which are identical to those which would be generated by an external transaction processing system in order that testing can be performed locally to the person using the system 1 and that test logging information will be available immediately and in much greater detail than is typical when a transaction is communicated to the external system B.

In Mode (iii) the controller 2 is not involved, the terminal T communicating directly with the external system B as it would in use. With absence of the controller 2 there are only two data monitoring points, 100 and 101.

Finally, in Mode (iv) the probe 3 is not used and the controller 2 simulates a terminal communicating with the external system B, typically for purposes of testing the performance or responses of the external system B, though there are other purposes.

The test controller permits a multiplicity of connections to be made to each of the data points. This will permit, for example, in Mode (iv), a test controller 2 suitably equipped with a bank of modems, to simulate an external system's population of terminals, to determine (for example) the performance characteristics of the external system B. Likewise, by varying the type of the connection at each data point, the test controller 2 permits the testing and conformance verification of different configurations of external system B, for example, in extending the previous example, by adding a group of TCP/IP connections and so simulating external traffic from other external systems, in addition to its own terminal population.

Versatility of the test system 1 will be apparent from reference to FIG. 5.

Test Scenarios

The following are a number of scenarios in which the test system 1 could be used.
  Terminal T testing, such as pre-certification testing for chip & pin cards.
  Testing of specific supplied test-cards, such as are required for pre-certification testing with international payment networks.
  Testing new functionality of the terminal T. The system 1 can be updated to incorporate tests for this additional functionality and minimises the need for the system B to go to the retailer site to test this functionality, or require the retailer to send an identical set-up to them or to a third party for manual testing.
  Testing of downloads of data to the card.
  Testing of tracking of specific cards.
  Testing of currency changeovers and/or specific currency processing.

Where the test system 1 is used for pre-certification testing, the terminal T may be connected to a test system B rather than a live system. (Mode (iii)). The connections—the actual link and the protocols used—between the terminal T and the test system B will be the same as with a live system.

The use of the test system 1 proceeds in the following manner:
  1. The user is prompted to perform a specific test transaction using a particular test card C. This involves placing the card in the probe 3, placing the interface 5 in the slot S, and performing the normal operations on the terminal T for that transaction type.
  2. The user may be required to enter certain information, similar to what an actual card user at a point-of-sale terminal would enter.
  3. The results of the card to reader communications are logged and checked, using criteria stored in the database 14.
  4. The results of the terminal T to system B are logged and checked according to criteria stored in the database 14 (Mode (ii)).
  5. The above two sets of communications are checked for conformance and classification, using rules in the database 14.

The response is immediate, and the test system 1 can specifically indicate at which of the possible six data monitoring points 100–105 a communication satisfied the criteria defined within the database 14 for a test to be considered passed.

In one case, knowing the state of the card C and the terminal T and a communication from the terminal T to the system B, the system 1 can determine if the communication back from the system B to the terminal T is (a) valid as an independent and out of context communication, and (b) is valid in the context of the state of the card and terminal communications that occurred before and after and any other conditions stored in the database 14.

The example above demonstrates a means to check that the system B is operating properly, that a communication is valid in the context of what went before, and the states each component was in.

The three sets of results, as well as the communications logs are stored. The results can be presented immediately after each test transaction on a given card.

The invention is not limited to the embodiments described but may be varied in construction and detail. Where the terminal under test does not receive a card, the details of the transaction can be inputted through a keypad attached to the terminal. This type of transaction can occur when dealing with mail-order transactions initiated without a physical card being present at the point-of-sale. When the terminal exists only as a logical device within a computer, the details of the transaction can be inputted through the computer's keyboard or some other input device. This type of transaction can occur over the internet or other like network. In either case, the test controller 2 functions as before, but without the use of the probe 3.

The invention claim is:

1. A test system for testing transaction processing equipment, the test system comprising:
   a probe,
   a test controller, and
   a controller interface for capturing monitored data, wherein, the probe comprises:
      a card reader for reading a card presented for a test and for routing card data to a terminal of said transaction processing equipment,
      an interface to the transaction terminal, said interface being connected to the card reader,
      a monitoring circuit to passively monitor data transmitted from the terminal to a card and data transmitted from the card to the terminal, wherein the monitoring circuit monitors signals via an opto-isolator, and
      a switch connected to the opto-isolator for switching between card signal frequencies to choose an appropriate frequency;
   the system comprises a database for storing monitored data and transaction conformance data;
   the system comprises a transaction conformance verifier for verifying operations of the transaction processing equipment
   under test by comparing monitored data and the conformance data.

2. The test system as claim in claim 1, wherein the probe routes the card data to the controller interface.

3. The test system as claim in claim 1, wherein the probe routes the card data on a hard-wired link to contact pads on the interface to the transaction terminal.

4. The test system as claim in claim 3, wherein the interface has at its extremity a configuration identical to that of a card, but is longer than a card to accommodate different terminal physical configurations.

5. The test system as claim in claim 1, wherein the probe comprises a control unit for generating probe status outputs.

6. The test system as claim in claim 5, wherein the outputs indicate if the probe is transmitting monitored data to the controller interface.

7. The test system as claim in claim 5, wherein
   the outputs indicate if a card is correctly inserted into the probe.

8. The test system as claim in claim 5, wherein the outputs indicate if the probe is correctly connected to the terminal.

9. The test system as claim in claim 1, wherein the probe converts the monitored data to a test controller format, and routes it in that format to the test controller.

10. The test system as claim in claim 1, wherein the test controller comprises an interface to the terminal and an interface to an external transaction processing system.

11. The test system as claim in claim 10, wherein the test controller performs bi-directional routing between the terminal and the external system.

12. The test system as claim in claim 1, wherein the test controller comprises parsers for parsing monitored data and converting it into normalized format for the database.

13. The test system as claimed in claim 12, wherein the test controller comprises a switch engine for reading normalized data from the database and routing normalized data according to rules in the database.

14. The test system as claim in claim 12, wherein the test controller comprises a switch engine for reading normalized data from the database and routing normalized data according to rules in the database; and wherein the switch engine uses elements of normalized data to execute said rules.

15. The test system as claim in claim 12, wherein the test controller comprises a switch engine for reading normalized data from the database and routing normalized data according to rules in the database; and wherein the switch engine uses elements of normalized data to execute said rules; and wherein the routing decisions may be to reject traffic, authorise data and return it to its source, or route data to a different communications parser.

16. The test system as claimed in claim 12, wherein the test controller comprises a switch engine for reading normalized data from the database and routing normalized data according to rules in the database; and wherein the switch engine routes data to the conformance verifier for verification according to rules in the database.

17. The test system as claimed in claim 1, wherein the verifier is configured to perform conformance verification in a mode having the following data monitoring points:
   a first point between the card and the terminal;
   a second point between the terminal and the card;
   a third point between the terminaL and the test system;
   a fourth point between the test system and the terminal;
   a fifth point between the external transaction processing system and the test system; and
   a sixth point between the test system and the external transaction processing system.

18. The test system as claimed in claim 17, wherein the verifier is configured to perform conformance verification in a mode having only the first, second, third, and fourth points.

19. The test system as claim in claim 17, wherein the verifier is configured to perform conformance verification in a mode having only the first, second, third, and fourth points; and wherein the test controller comprises a simulator for simulating an external transaction processing system as seen by the terminal.

20. The test system as claimed in claim 17, wherein the verifier is configured to perform conformance verification with data from only the first and second points.

21. The test system as claimed in claim 17, wherein the verifier is configured to perform conformance verification with data from only the fifth and sixth points.

22. The test system as claimed in claim 17, wherein the verifier is configured to perform conformance verification with data from only the fifth and sixth points; and wherein the test system comprises a simulator for simulating a terminal as seen by an external transaction processing system.

* * * * *